(12) United States Patent
Chen et al.

(10) Patent No.: US 10,393,811 B2
(45) Date of Patent: Aug. 27, 2019

(54) QUANTITATIVE EVALUATION METHOD FOR RELIABILITY OF MARKOV MODEL SWITCHED RELUCTANCE MOTOR SYSTEM

(71) Applicant: China University of Mining and Technology, Xuzhou, Jiangsu (CN)

(72) Inventors: Hao Chen, Jiangsu (CN); Xing Wang, Jiangsu (CN); Yuxiang Chen, Jiangsu (CN); Huan Yang, Jiangsu (CN)

(73) Assignee: CHINA UNIVERSITY OF MINING AND TECHNOLOGY, Xuzhou, Jiangsu (CN)

( * ) Notice: Subject to any disclaimer, the term of this patent is extended or adjusted under 35 U.S.C. 154(b) by 331 days.

(21) Appl. No.: 14/906,412

(22) PCT Filed: Aug. 22, 2014

(86) PCT No.: PCT/CN2014/084964
§ 371 (c)(1),
(2) Date: Jan. 20, 2016

(87) PCT Pub. No.: WO2015/078205
PCT Pub. Date: Jun. 4, 2015

(65) Prior Publication Data
US 2016/0161561 A1    Jun. 9, 2016

(30) Foreign Application Priority Data

Nov. 26, 2013 (CN) .......................... 2013 1 0608976

(51) Int. Cl.
G01R 31/34 (2006.01)
(52) U.S. Cl.
CPC .................................. G01R 31/34 (2013.01)

(58) Field of Classification Search
CPC ...................................................... G01R 31/34
See application file for complete search history.

(56) References Cited

U.S. PATENT DOCUMENTS

| | | | |
|---|---|---|---|
| 8,766,508 B2 | 7/2014 | Park | |
| 2004/0066165 A1* | 4/2004 | Kamio | H02P 6/16 318/701 |
| 2013/0088111 A1 | 4/2013 | Park | |

FOREIGN PATENT DOCUMENTS

| | | |
|---|---|---|
| CN | 102291068 A | 12/2011 |
| CN | 102945315 A | 2/2013 |

(Continued)

OTHER PUBLICATIONS

Wang et al., Reliability Evaluation of Accelerograph System Based on Markov Process, Aviation Precision Manufacturing Technology, Jun. 30, 2013, Abstract, pp. 55-57, vol. 49, No. 3.

(Continued)

*Primary Examiner* — Yu-Hsi D Sun
(74) *Attorney, Agent, or Firm* — TraskBritt

(57) ABSTRACT

A quantitative evaluation method for the reliability of a Markov model switched reluctance motor system. The method comprises: solving a probability matrix $P'^T(t)$ of a switched reluctance motor system being in any survival state at any time t via a state conversion diagram of the switched reluctance motor system; calculating the sum of various elements of the probability matrix $P'^T(t)$ of the survival state, so that a reliability function $R(t)$ is obtained; and thus calculating the average working time of the switched reluctance motor system before failure, thereby realizing the quantitative evaluation of the switched reluctance motor system and satisfying the requirements for the reliability analysis of a switched reluctance motor drive system. This disclosure has a good engineering application value.

8 Claims, 2 Drawing Sheets

(56) References Cited

FOREIGN PATENT DOCUMENTS

CN    103809119 A    5/2014
WO    2015078205 A1    4/2015

OTHER PUBLICATIONS

Lu, Shengli, Study on the Fault Diagnosis Methods of Switched Reluctance Motor System, China Doctoral Dissert5ations Full-text Databases (Engineering Science and Technology II), Feb. 28, 2011, Abstract.
PCT International Search Report, PCT/CN2014/084964, dated Nov. 13, 2014.

* cited by examiner

QUANTITATIVE EVALUATION METHOD FOR RELIABILITY OF MARKOV MODEL SWITCHED RELUCTANCE MOTOR SYSTEM

CROSS-REFERENCE TO RELATED APPLICATIONS

This application is a national phase entry under 35 U.S.C. § 371 of International Patent Application PCT/CN2014/084964, filed Aug. 22, 2014, designating the United States of America and published in English as International Patent Publication WO 2015/078205 A1 on Apr. 6, 2015, which claims the benefit under Article 8 of the Patent Cooperation Treaty and under 35 U.S.C. § 119(e) to China Patent Application Serial No. 2013 10608976.2 2013, filed Nov. 26, 2013.

TECHNICAL FIELD

This disclosure relates to a quantitative assessment method, in particular, to a Markov model-based method for quantitative assessment of reliability of switched reluctance motor system, which is applicable to different types of switched reluctance motor systems with any number of phases.

BACKGROUND

A switched reluctance motor drive system has high fault-tolerance and reliability, and can continue its operation under certain fault conditions, owing to the mutual independence among the phases of the main circuit of the power converter and among the magnetic circuits of the phases of the motor. Therefore, the system can continue its operation and should not simply be deemed as system fault even when a constituting unit of the system fails, as long as the performance parameters of the system are still within a permissible range. Such outstanding fault tolerance performance introduces a new challenge in reliability study. For instance, suppose that the system can still operate after a unit of the system fails. What impacts on system operation will there be when a secondary fault occurs? How is an assessment of the system operation condition and reliability index performed after multiple levels of faults occur in the system? In the conventional modeling method based on a reliability block diagram, the system operation states are simplified into "normal state" and "failure state," but a "fault operation state" is ignored. Therefore, that method cannot meet the requirements of reliability analysis of a switched reluctance motor drive system.

BRIEF SUMMARY

Provided is a Markov model-based method for quantitative assessment of reliability of switched reluctance motor systems, which can be used for quantitative assessment of reliability of a switched reluctance motor system.

The Markov model-based method for quantitative assessment of reliability of switched reluctance motor systems provided in this disclosure is as follows:

Obtain a probability matrix $P'^T(t)$ of the switched reluctance motor system at any time t in any survival state, on the basis of a state transition diagram of the switched reluctance motor system:

$$P'^T(t) = \begin{bmatrix} \exp(-3.5928t) \\ 0.1699\exp(-3.3369t) - 0.1699\exp(-3.5928t) \\ 5.1928\exp(-3.5928t) - 5.1928\exp(-3.9168t) \\ 0.4666\exp(-2.4156t) - 0.4666\exp(-3.5928t) \\ 0.2546\exp(-3.5928t) - 0.2546\exp(-3.7578t) \\ 0.7432\exp(-3.5363t) - 0.7432\exp(-3.5928t) \\ 0.882\exp(-3.3369t) - 4.1868\exp(-3.5928t) + 3.3048\exp(-3.6611t) \\ 0.0651\exp(-3.5928t) - 0.0793\exp(-3.3369t) + 0.0142\exp(-2.1598t) \\ 0.0786\exp(-3.5928t) + 0.0432\exp(-3.3369t) - 0.1218\exp(-3.502t) \\ 0.0229\exp(-3.5928t) - 0.1265\exp(-3.3369t) + 0.1036\exp(-3.2805t) \\ 3.3067\exp(-3.5928t) + 0.8831\exp(-3.9168t) - 4.1898\exp(-3.6611t) \\ 2.4234\exp(-3.9168t) - 3.2209\exp(-3.5928t) + 0.7975\exp(-2.6082t) \\ 2.7266\exp(-3.5928t) + 0.8938\exp(-3.9168t) - 3.6204\exp(-3.6728t) \\ 0.0142\exp(-3.5928t) + 0.0652\exp(-2.1598t) - 0.0793\exp(-2.4156t) \\ 0.3278\exp(-2.4156t) - 1.5188\exp(-3.5928t) + 1.191\exp(-3.9168t) \\ 4.5113 \times 10^{-4}\exp(-3.5928t) + 0.2603\exp(-3.5928t) - 0.2608\exp(-2.4156t) \\ 0.0171\exp(-3.5928t) - 0.6029\exp(-2.4491t) + 0.5858\exp(-2.4156t) \\ 0.0154\exp(-3.5928t) + 0.191\exp(-2.3207t) - 0.2064\exp(-2.4156t) \\ 0.0433\exp(-3.7578t) - 0.122\exp(-3.5928t) + 0.0787\exp(-3.502t) \\ 0.0171\exp(-2.4492t) - 0.1359\exp(-3.5928t) + 0.11888\exp(-3.7578t) \\ 0.1035\exp(-3.5928t) + 0.0229\exp(-3.2805t) - 0.1263\exp(-3.5363t) \\ 4.1245\exp(-3.5363t) - 5.0445\exp(-3.5928t) + 0.92\exp(-3.8462t) \\ 0.3314\exp(-3.5928t) - 0.3468\exp(-3.5363t) + 0.0154\exp(-2.3206t) \end{bmatrix} \quad (1)$$

where exp represents an exponential function and t represents time.

Calculate the sum of all elements in the probability matrix $P'^T(t)$ in the survival state from expression (1), to obtain a reliability function R(t):

$$R(t) = \sum_{i=0}^{22} P_i(t) = -5.2143\exp(-3.5928t) + 0.8893\exp(-3.3369t) +$$
$$0.1985\exp(-3.9168t) + 0.8337\exp(-2.4156t) -$$
$$0.0925\exp(-3.7578t) + 4.3946\exp(-3.5363t) -$$
$$0.885\exp(-3.6611t) + 0.0794\exp(-2.1598t) -$$
$$0.1218\exp(-3.5028t) + 0.1265\exp(-3.2805t) +$$
$$0.7975\exp(-2.6082t) - 3.6204\exp(-3.6728t) +$$
$$2.7408\exp(-3.5929t) - 0.6029\exp(-2.4491t) +$$
$$0.191\exp(-2.3207t) + 0.0171\exp(-2.4492t) + 0.92\exp(-3.8462t) +$$
$$0.0154\exp(-2.3206t) + 0.0787\exp(-3.502t) + 0.2546\exp(-3.5929t)$$

Calculate the mean time to failure (MTTF) of the switched reluctance motor system:

$$MTTF = \int_0^\infty R(t)\,dt \quad (2)$$

and thereby carry out quantitative assessment of reliability of the switched reluctance motor system.

Benefits: Since a Markov reliability model is established for a switched reluctance motor system, the mean time to failure (MTTF) of the switched reluctance motor system can be calculated and, thereby, quantitative assessment of reliability of the switched reluctance motor system can be carried out. A switched reluctance motor system can continue its operation and should not simply be deemed as system fault, even if a constituting unit of the system fails, as long as the performance parameters of the system are still within a permissible range. In order to meet the requirements of reliability analysis of a switched reluctance motor system, assessment can be performed as to whether it can continue its operation after a constituting unit of the system fails and whether it can still continue its operation if a secondary failure or multilevel failure occurs. The method provided in this disclosure has high practicability and high engineering application values.

DETAILED DESCRIPTION

This disclosure will be detailed in embodiments with reference to the accompanying drawings.

The primary faults are determined for a switched reluctance motor system, as shown in Table 1. Secondary faults are considered for the five survival states shown in Table 1, and the operation performance of the system with two types of faults in combination is simulated, and a result of system operation under the condition of secondary faults is obtained, as shown in Table 2. The system will fail if any three constituting elements of the switched reluctance motor system fail at the same time.

TABLE 1

| Primary Faults | |
| --- | --- |
| Fault Pattern | System State |
| Capacitor open circuit (CK) | S (survival state) |
| Capacitor short circuit (CD) | F (failure state) |
| One phase-deficient operation (DP) | S (survival state) |
| Conducting transistor short circuit ($V_{ON}D$) | S (survival state) |
| Switch tube short circuit ($V_{SW}D$) | F (failure state) |
| Flywheel diode open circuit (DK) | F (failure state) |
| Current detection circuit output is zero persistently (CUZ) | F (failure state) |
| Current detection circuit output is 1 persistently (CUH) | S (survival state) |
| Parameter drift of current detection circuit (CUF) | S (survival state) |
| Rotation speed detection circuit output is zero persistently (VZ) | F (failure state) |
| Rotation speed detection circuit output is 1 persistently (VH) | F (failure state) |
| Parameter drift of rotation speed detection circuit (VF) | F (failure state) |

In Table 1: Five types of faults, i.e., conducting transistor open circuit (VONK) fault, switch tube open circuit (VSWK) fault, flywheel diode short circuit (DD) fault, one phase short circuit (PD) fault, and one phase open circuit (PK) fault, are generally concluded as one phase-deficient (DP) fault.

TABLE 2

| | Secondary Faults | | | | | | | | | | | |
| --- | --- | --- | --- | --- | --- | --- | --- | --- | --- | --- | --- | --- |
| Primary | Secondary Fault | | | | | | | | | | | |
| Fault | CK | CD | DP | $V_{ON}D$ | $V_{SW}D$ | DK | CUZ | CUH | CUF | VZ | VH | VF |
| CK | | | S | S | F | F | F | S | S | F | F | F |
| DP | S | F | | F | S | F | F | F | F | S | F | F |
| $V_{ON}D$ | S | F | S | | F | S | F | S | S | F | F | F |
| CUH | S | F | F | S | F | F | | | F | F | F | F |
| CUF | S | F | S | S | F | F | | | | F | F | F |

In Table 2, the letter symbols have the same meaning as those in Table 1, and the slashes mean those phenomena never happen.

Figure 1:
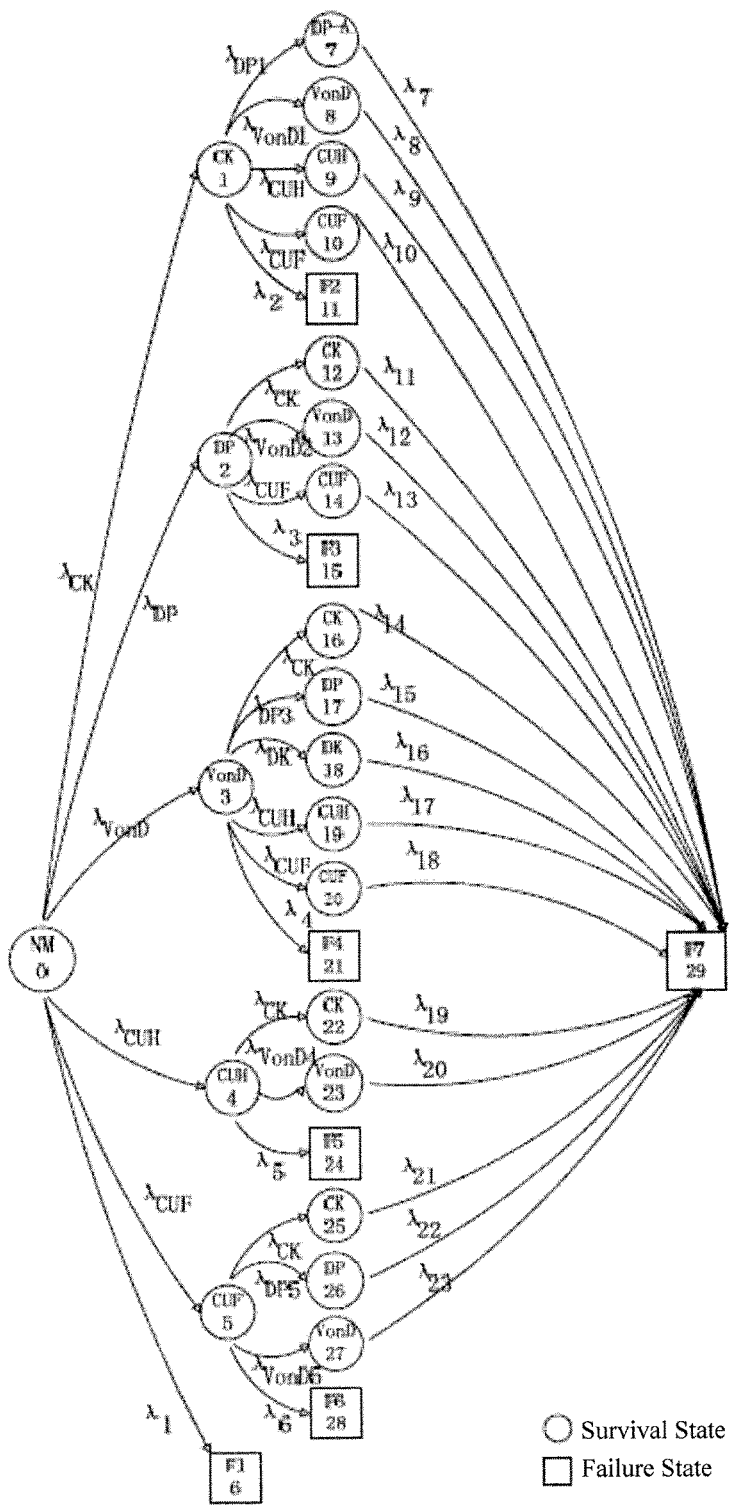
FIG. 1 is a state transition diagram of a switched reluctance motor system according to this disclosure.

FIG. 1 shows a state transition diagram of a switched reluctance motor system. In FIG. 1, the symbols enclosed in circles represent system states, wherein, the Arabic numerals represent state numbers, and the letters represent fault patterns of the system, the meanings of which are shown in Table 3, except NM, which represents normal state, and F, which represents failure state.

TABLE 3

Meanings of State Symbols in the State Transition Diagram

| State Symbol | Meaning |
|---|---|
| NM0 | State 0, normal operation state |
| CK1 | State 1, the system converts to survival state after a capacitor open circuit fault occurs |
| DP2 | State 2, the system converts to survival state after a one phase-deficient fault occurs |
| VonD3 | State 3, the system converts to survival state after a conducting transistor short circuit fault occurs |
| CUH4 | State 4, the system converts to survival state after a "current detection circuit output is a constant value" fault occurs |
| CUF5 | State 5, the system converts to survival state after an "output parameter drift of current detection circuit" fault occurs |
| F1 | State 6, failure state, which corresponds to 7 fault patterns, i.e., capacitor short circuit (CD), switch tube short circuit ($V_{SW}D$), diode open circuit (DK), current detection circuit output is zero persistently (CUZ), rotation speed detection circuit output is zero persistently (VZ), rotation speed detection circuit output is a constant value persistently (VH), and parameter drift of rotation speed detection circuit (VF). |
| DP-A7 | State 7, the system converts to survival state after phase A-deficient fault following capacitor open circuit fault occurs |
| VonD8 | State 8, the system converts to survival state after conducting transistor short circuit fault occurs following capacitor open circuit fault |
| CUH9 | State 9, the system converts to survival state after "current detection circuit output is a constant value persistently" fault occurs following capacitor open circuit fault |
| CUF10 | State 10, the system converts to survival state after "output parameter drift of current detection circuit" fault occurs following capacitor open circuit fault |
| F2 | State 11, the system converts to failure state after a secondary fault occurs following capacitor open circuit fault, which corresponds to 6 fault patterns, i.e., switch tube short circuit ($V_{SW}D$), diode open circuit (DK), current detection circuit output is zero persistently (CUZ), rotation speed detection circuit output is zero persistently (VZ), rotation speed detection circuit output is a constant value persistently (VH), and parameter drift of rotation speed detection circuit (VF). |
| CK12 | State 12, the system converts to survival state after capacitor open circuit fault occurs following one phase-deficient fault |
| VonD13 | State 13, the system converts to survival state after conducting transistor short circuit fault occurs following one phase-deficient fault |
| CUF14 | State 14, the system converts to survival state after "output parameter drift of current detection circuit" fault occurs following one phase-deficient fault |
| F3 | State 15, the system converts to failure state after a secondary fault occurs following one phase-deficient fault, which corresponds to 9 fault patterns, i.e., capacitor short circuit (CD), one neighboring phase-deficient fault (DP), switch tube short circuit ($V_{SW}D$), diode open circuit (DK), current detection circuit output is zero persistently (CUZ), current speed detection circuit output is a constant value persistently (CUH), rotation speed detection circuit output is zero persistently (VZ), rotation speed detection circuit output is a constant value persistently (VH), and parameter drift of rotation speed detection circuit (VF). |
| CK16 | State 16, the system converts to survival state after capacitor open circuit fault occurs following conducting transistor short circuit fault |
| DP17 | State 17, the system converts to survival state after one phase-deficient fault occurs following conducting transistor short circuit fault |
| DK18 | State 18, the system converts to survival state after diode open circuit fault occurs following conducting transistor short circuit fault |
| CUH19 | State 19, the system converts to survival state after "current detection circuit output is a constant value persistently" fault occurs following conducting transistor short circuit fault |
| CUF20 | State 20, the system converts to survival state after "output parameter drift of current detection circuit" fault occurs following conducting transistor short circuit fault |
| F4 | State 21, the system converts to failure state after a secondary fault occurs following conducting transistor short circuit fault, which corresponds to 6 fault patterns, i.e., capacitor short circuit (CD), switch tube short circuit ($V_{SW}D$), current detection circuit output is zero persistently (CUZ), rotation speed detection circuit output is zero persistently (VZ), rotation speed detection circuit output is a constant value persistently (VH), and parameter drift of rotation speed detection circuit (VF). |
| CK22 | State 22, the system converts to survival state after capacitor open circuit fault occurs following "current detection circuit output is a constant value persistently" fault |
| VonD23 | State 23, the system converts to survival state after conducting transistor short circuit fault occurs following "current detection circuit output is a constant value persistently" fault |

TABLE 3-continued

Meanings of State Symbols in the State Transition Diagram

| State Symbol | Meaning |
|---|---|
| F5 | State 24, the system converts to failure state after a secondary fault occurs following a primary fault "current detection circuit output is a constant value persistently," which corresponds to 7 fault patterns, i.e., capacitor short circuit (CD), one phase-deficient fault (DP), switch tube short circuit ($V_{SW}D$), diode open circuit (DK), rotation speed detection circuit output is zero persistently (VZ), rotation speed detection circuit output is a constant value persistently (VH), and parameter drift of rotation speed detection circuit (VF). |
| CK25 | State 25, the system converts to survival state after capacitor open circuit fault occurs following "output parameter drift of current detection circuit" fault |
| DP26 | State 26, the system converts to survival state after one phase open circuit fault occurs following "output parameter drift of current detection circuit" fault |
| VonD27 | State 27, the system converts to survival state after conducting transistor short circuit fault occurs following "output parameter drift of current detection circuit" fault |
| F6 | State 28, the system converts to failure state after a secondary fault occurs following a primary fault (output parameter drift of current detection circuit), which corresponds to 6 fault patterns, i.e., capacitor short circuit (CD), switch tube short circuit ($V_{SW}D$), diode open circuit (DK), rotation speed detection circuit output is zero persistently (VZ), rotation speed detection circuit output is a constant value persistently (VH), and parameter drift of rotation speed detection circuit (VF). |
| F7 | State 29, the system converts to failure state when any tertiary fault occurs. |

The failure rate of any fault element in FIG. 1 is represented by a symbol 2, with a suffix indicating the fault pattern of the element, for example, $\lambda_{CK}$ represents the failure rate of capacitor open circuit fault, $\lambda_{DP1}$ represents the failure rate of phase A-deficient fault following capacitor open circuit fault, $\lambda_{VonD1}$ represents the failure rate of conducting transistor short circuit fault following capacitor open circuit fault, $\lambda_{VonD2}$ represents the failure rate of conducting transistor short circuit fault following one phase-deficient fault, $\lambda_{DP3}$ represents the failure rate of another one phase-deficient fault following conducting transistor short circuit fault, $\lambda_{VonD4}$ represents the failure rate of another conducting transistor short circuit fault following "current detection circuit output is a constant value persistently" fault, $\lambda_{DP5}$ represents the failure rate of another one phase-deficient fault following "output parameter drift of current detection circuit" fault, and $\lambda_{VonD5}$ represents the failure rate of another conducting transistor short circuit fault following "output parameter drift of current detection circuit" fault. For other failure rates, failure patterns of the elements indicated by the suffixes are the same as those shown in Table 1. See Table 4 for the meanings of failure rates $\lambda_1$-$\lambda_{23}$. The fault patterns of elements indicated by the suffixes of failure rates in Table 4 are the same as those in Table 1.

TABLE 4

Meanings of the Failure Rates in the State Transition Diagram

| Symbol of Failure Rate | Meaning |
|---|---|
| $\lambda_1$ | $\lambda_1 = \lambda_{CD} + \lambda_{V_{sw}D} + \lambda_{DK} + \lambda_{CUZ} + \lambda_{VZ} + \lambda_{VH} + \lambda_{VF}$ |
| $\lambda_2$ | $\lambda_2 = \lambda_{V_{sw}D} + \lambda_{DK} + \lambda_{CUZ} + \lambda_{VZ} + \lambda_{VH} + \lambda_{VF}$ |
| $\lambda_3$ | $\lambda_3 = \lambda_{CD} + \lambda_{DP} + \lambda_{V_{sw}D} + \lambda_{DK} + \lambda_{CUH} + \lambda_{CUZ} + \lambda_{VZ} + \lambda_{VH} + \lambda_{VF}$ |
| $\lambda_4$ | $\lambda_4 = \lambda_{CD} + \lambda_{V_{sw}D} + \lambda_{CUZ} + \lambda_{VZ} + \lambda_{VH} + \lambda_{VF}$ |
| $\lambda_5$ | $\lambda_5 = \lambda_{CD} + \lambda_{DP} + \lambda_{V_{sw}D} + \lambda_{DK} + \lambda_{VZ} + \lambda_{VH} + \lambda_{VF}$ |
| $\lambda_6$ | $\lambda_6 = \lambda_{CD} + \lambda_{V_{sw}D} + \lambda_{DK} + \lambda_{VZ} + \lambda_{VH} + \lambda_{VF}$ |
| $\lambda_7, \lambda_{11}$ | $\lambda_7 = \lambda_{11} = \lambda_{DP} + \lambda_{V_{on}D} + \lambda_{V_{sw}D} + \lambda_{DK} + \lambda_{CUH} + \lambda_{CUZ} + \lambda_{CUF} + \lambda_{VZ} + \lambda_{VH} + \lambda_{VF}$ |
| $\lambda_8, \lambda_{14}$ | $\lambda_8 = \lambda_{14} = \lambda_{DP} + \lambda_{DK} + \lambda_{CUH} + \lambda_{CUZ} + \lambda_{CUF} + \lambda_{VZ} + \lambda_{VH} + \lambda_{VF}$ |
| $\lambda_9, \lambda_{10}, \lambda_{19}, \lambda_{21}$ | $\lambda_9 = \lambda_{10} = \lambda_{19} = \lambda_{21} = \lambda_{DP} + \lambda_{V_{on}D} + \lambda_{V_{sw}D} + \lambda_{DK} + \lambda_{VZ} \lambda_{VH} + \lambda_{VF}$ |
| $\lambda_{12}, \lambda_{15}$ | $\lambda_{12} = \lambda_{15} = \lambda_{CK} + \lambda_{CD} + \lambda_{DP} + \lambda_{DK} + \lambda_{CUH} + \lambda_{CUZ} + \lambda_{CUF} + \lambda_{VZ} + \lambda_{VH} + \lambda_{VF}$ |
| $\lambda_{13}, \lambda_{22}$ | $\lambda_{13} = \lambda_{22} = \lambda_{CK} + \lambda_{CD} + \lambda_{DP} + \lambda_{V_{on}D} + \lambda_{V_{sw}D} + \lambda_{DK} + \lambda_{VZ} + \lambda_{VH} + \lambda_{VF}$ |
| $\lambda_{16}$ | $\lambda_{16} = \lambda_{CK} + \lambda_{CD} + \lambda_{DP} + \lambda_{CUZ} + \lambda_{CUF} + \lambda_{VZ} + \lambda_{VH} + \lambda_{VF}$ |
| $\lambda_{17}, \lambda_{18}, \lambda_{20}, \lambda_{23}$ | $\lambda_{17} = \lambda_{18} = \lambda_{20} = \lambda_{23} = \lambda_{CK} + \lambda_{CD} + \lambda_{DP} + \lambda_{DK} + \lambda_{VZ} + \lambda_{VH} + \lambda_{VF}$ |

In FIG. 1, the state transition diagram of switched reluctance motor system consists of four layers from left to right, wherein, the first layer contains one operation state, i.e., normal state 0 (NM); the second layer contains six operation states, which correspond to the system states after a primary fault occurs, and correspond to those shown in Table 1; the third layer contains 22 operation states, which correspond to the system conditions after a secondary failure occurs (i.e., two constituting elements of the system fail at the same time), and correspond to those shown in Table 2; the fourth layer contains one operation state, i.e., failure state, which corresponds to the system conditions when three constituting elements of the system fail at the same time.

When a primary fault "capacitor open circuit (CK)" occurs in the switched reluctance motor system, the system will transit into state 1 (CK), and the state transition rate is the failure rate $\lambda_{CK}$ of capacitor open circuit fault. If the system cannot operate normally after a capacitor short circuit (CD) fault, the system will enter into failure state F1, which is indicated by a box. Because it is unnecessary to carry out further analysis to the failure state F of the system, the failure states are concluded into one state, i.e., state F1 includes seven different operation states: capacitor short circuit (CD), switch tube short circuit ($V_{SW}$D), diode open circuit (DK), current detection circuit output is zero persistently (CUZ), rotation speed detection circuit output is zero persistently (VZ), rotation speed detection circuit output is a constant value persistently (VH), and output parameter drift of rotation speed detection circuit (VF), and the failure rate is $\lambda_1$.

Obtain a probability matrix $P'^T(t)$ of the switched reluctance motor system at any time t in any survival state, on the basis of the state transition diagram of the switched reluctance motor system shown in FIG. 1:

$$P'^T(t) = \begin{bmatrix} \exp(-3.5928t) \\ 0.1699\exp(-3.3369t) - 0.1699\exp(-3.5928t) \\ 5.1928\exp(-3.5928t) - 5.1928\exp(-3.9168t) \\ 0.4666\exp(-2.4156t) - 0.4666\exp(-3.5928t) \\ 0.2546\exp(-3.5928t) - 0.2546\exp(-3.7578t) \\ 0.7432\exp(-3.5363t) - 0.7432\exp(-3.5928t) \\ 0.882\exp(-3.3369t) - 4.1868\exp(-3.5928t) + 3.3048\exp(-3.6611t) \\ 0.0651\exp(-3.5928t) - 0.0793\exp(-3.3369t) + 0.0142\exp(-2.1598t) \\ 0.0786\exp(-3.5928t) + 0.0432\exp(-3.3369t) - 0.1218\exp(-3.502t) \\ 0.0229\exp(-3.5928t) - 0.1265\exp(-3.3369t) + 0.1036\exp(-3.2805t) \\ 3.3067\exp(-3.5928t) + 0.8831\exp(-3.9168t) - 4.1898\exp(-3.6611t) \\ 2.4234\exp(-3.9168t) - 3.2209\exp(-3.5928t) + 0.7975\exp(-2.6082t) \\ 2.7266\exp(-3.5928t) + 0.8938\exp(-3.9168t) - 3.6204\exp(-3.6728t) \\ 0.0142\exp(-3.5928t) + 0.0652\exp(-2.1598t) - 0.0793\exp(-2.4156t) \\ 0.3278\exp(-2.4156t) - 1.5188\exp(-3.5928t) + 1.191\exp(-3.9168t) \\ 4.5113 \times 10^{-4}\exp(-3.5928t) + 0.2603\exp(-3.5928t) - 0.2608\exp(-2.4156t) \\ 0.0171\exp(-3.5928t) - 0.6029\exp(-2.4491t) + 0.5858\exp(-2.4156t) \\ 0.0154\exp(-3.5928t) + 0.191\exp(-2.3207t) - 0.2064\exp(-2.4156t) \\ 0.0433\exp(-3.7578t) - 0.122\exp(-3.5928t) + 0.0787\exp(-3.502t) \\ 0.0171\exp(-2.4492t) - 0.1359\exp(-3.5928t) + 0.11888\exp(-3.7578t) \\ 0.1035\exp(-3.5928t) + 0.0229\exp(-3.2805t) - 0.1263\exp(-3.5363t) \\ 4.1245\exp(-3.5363t) - 5.0445\exp(-3.5928t) + 0.92\exp(-3.8462t) \\ 0.3314\exp(-3.5928t) - 0.3468\exp(-3.5363t) + 0.0154\exp(-2.3206t) \end{bmatrix} \quad (1)$$

where, exp represents an exponential function, and t represents time.

Calculate the sum of all elements in the probability matrix $P'^T(t)$ in the survival state from expression (1), to obtain a reliability function R(t):

$$R(t) = \sum_{i=0}^{22} P_i(t) = -5.2143\exp(-3.5928t) + 0.8893\exp(-3.3369t) +$$
$$0.1985\exp(-3.9168t) + 0.8337\exp(-2.4156t) -$$
$$0.0925\exp(-3.7578t) + 4.3946\exp(-3.5363t) -$$
$$0.885\exp(-3.6611t) + 0.0794\exp(-2.1598t) -$$
$$0.1218\exp(-3.5028t) + 0.1265\exp(-3.2805t) +$$
$$0.7975\exp(-2.6082t) - 3.6204\exp(-3.6728t) +$$
$$2.7408\exp(-3.5929t) - 0.6029\exp(-2.4491t) +$$
$$0.191\exp(-2.3207t) + 0.0171\exp(-2.4492t) + 0.92\exp(-3.8462t) +$$
$$0.0154\exp(-2.3206t) + 0.0787\exp(-3.502t) + 0.2546\exp(-3.5929t)$$

Calculate the mean time to failure (MTTF) of the switched reluctance motor system:

$$MTTF = \int_0^\infty R(t)dt \quad (2)$$

and, thereby, carry out quantitative assessment of reliability of the switched reluctance motor system.

Figure 2:
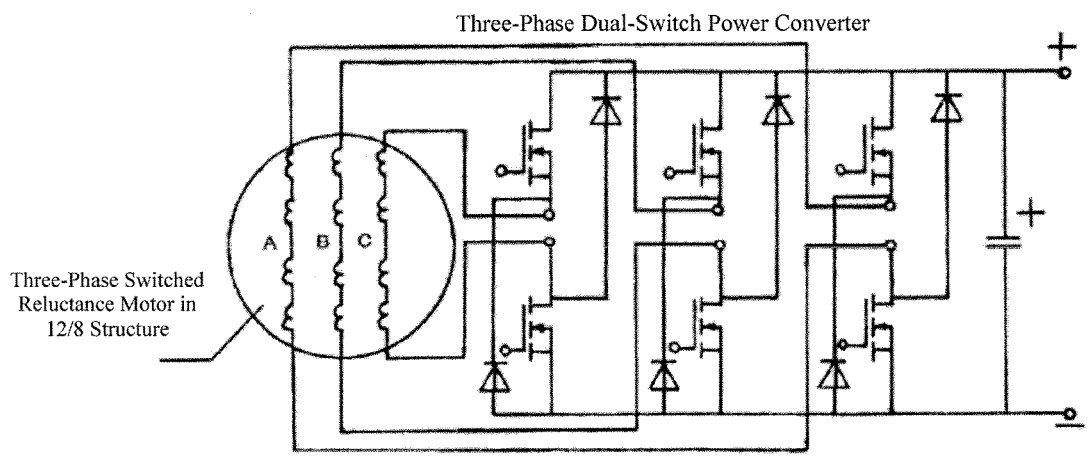
FIG. 2 shows a circuit diagram of a three-phase dual-switch power converter.
Figure 3:
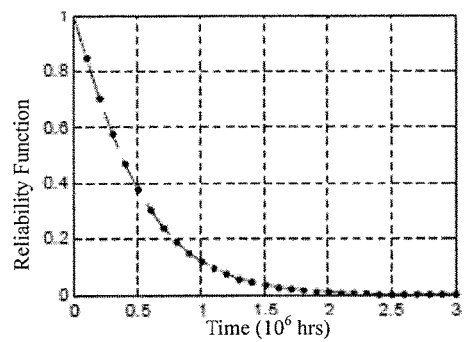
FIG. 3 shows a curve chart of reliability function obtained from a Markov reliability model of the switched reluctance motor system according to this disclosure.

For example, for a switched reluctance motor system consisting of a three-phase switched reluctance motor in 12/8 structure and a three-phase dual-switch power converter, as shown in FIG. 2, on the basis of the state transition diagram of the switched reluctance motor system shown in FIG. 1, a probability matrix $P'^T(t)$ of the three-phase switched reluctance motor system at any time t in any survival state is obtained, and the sum of all elements in the probability matrix $P'^T(t)$ in the survival state is calculated, so as to obtain a reliability function R(t); as shown in FIG. 3, the mean time to failure (MTTF) of the three-phase switched reluctance motor system is calculated according to the reliability function R(t), and thereby quantitative assessment of reliability can be carried out for the three-phase switched reluctance motor system.

The invention claimed is:

1. A Markov model-based method for determining whether to turn a switched reluctance motor system off or on, the method comprising;
   detecting failure of a first constituting element of the switched reluctance motor system;
   calculating a mean time to failure of the switched reluctance motor system by obtaining a probability matrix $P^T(t)$ of the switched reluctance motor system at any time t in any operational state, on the basis of a state transition diagram of the switched reluctance motor system:

$$P'^T(t) = \begin{bmatrix} \exp(-3.5928t) \\ 0.1699\exp(-3.3369t) - 0.1699\exp(-3.5928t) \\ 5.1928\exp(-3.5928t) - 5.1928\exp(-3.9168t) \\ 0.4666\exp(-2.4156t) - 0.4666\exp(-3.5928t) \\ 0.2546\exp(-3.5928t) - 0.2546\exp(-3.7578t) \\ 0.7432\exp(-3.5363t) - 0.7432\exp(-3.5928t) \\ 0.882\exp(-3.3369t) - 4.1868\exp(-3.5928t) + \\ \quad 3.3048\exp(-3.6611t) \\ 0.0651\exp(-3.5928t) - 0.0793\exp(-3.3369t) + \\ \quad 0.0142\exp(-2.1598t) \\ 0.0786\exp(-3.5928t) + 0.0432\exp(-3.3369t) - \\ \quad 0.1218\exp(-3.502t) \\ 0.0229\exp(-3.5928t) - 0.1265\exp(-3.3369t) + \\ \quad 0.1036\exp(-3.2805t) \\ 3.3067\exp(-3.5928t) + 0.8831\exp(-3.9168t) - \\ \quad 4.1898\exp(-3.6611t) \\ 2.4234\exp(-3.9168t) - 3.2209\exp(-3.5928t) + \\ \quad 0.7975\exp(-2.6082t) \\ 2.7266\exp(-3.5928t) + 0.8938\exp(-3.9168t) - \\ \quad 3.6204\exp(-3.6728t) \\ 0.0142\exp(-3.5928t) + 0.0652\exp(-2.1598t) - \\ \quad 0.0793\exp(-2.4156t) \\ 0.3278\exp(-2.4156t) - 1.5188\exp(-3.5928t) + \\ \quad 1.191\exp(-3.9168t) \\ 4.5113 \times 10^{-4}\exp(-3.5928t) + 0.2603\exp(-3.5928t) - \\ \quad 0.2608\exp(-2.4156t) \\ 0.0171\exp(-3.5928t) - 0.6029\exp(-2.4491t) + \\ \quad 0.5858\exp(-2.4156t) \\ 0.0154\exp(-3.5928t) + 0.191\exp(-2.3207t) - \\ \quad 0.2064\exp(-2.4156t) \\ 0.0433\exp(-3.7578t) - 0.122\exp(-3.5928t) + \\ \quad 0.0787\exp(-3.502t) \\ 0.0171\exp(-2.4492t) - 0.1359\exp(-3.5928t) + \\ \quad 0.11888\exp(-3.7578t) \\ 0.1035\exp(-3.5928t) + 0.0229\exp(-3.2805t) - \\ \quad 0.1263\exp(-3.5363t) \\ 4.1245\exp(-3.5363t) - 5.0445\exp(-3.5928t) + \\ \quad 0.92\exp(-3.8462t) \\ 0.3314\exp(-3.5928t) - 0.3468\exp(-3.5363t) + \\ \quad 0.0154\exp(-2.3206t) \end{bmatrix} \quad (1)$$

where, exp represents an exponential function, and t represents time;

calculating the sum of all elements in the probability matrix $P^T(t)$ in the survival state from expression (1), to obtain a reliability function R(t):

$$R(t) = \sum_{i=0}^{22} P_i(t) = -5.2143\exp(-3.5928t) + 0.8893\exp(-3.3369t) +$$

$$0.1985\exp(-3.9168t) + 0.8337\exp(-2.4156t) -$$
$$0.0925\exp(-3.7578t) + 4.3946\exp(-3.5363t) -$$
$$0.885\exp(-3.6611t) + 0.0794\exp(-2.1598t) -$$
$$0.1218\exp(-3.5028t) + 0.1265\exp(-3.2805t) +$$
$$0.7975\exp(-2.6082t) - 3.6204\exp(-3.6728t) +$$
$$2.7408\exp(-3.5929t) - 0.6029\exp(-2.4491t) +$$
$$0.191\exp(-2.3207t) + 0.0171\exp(-2.4492t) + 0.92\exp(-3.8462t) +$$
$$0.0154\exp(-2.3206t) + 0.0787\exp(-3.502t) + 0.2546\exp(-3.5929t)$$

calculating the mean time to failure) (MTTF) of the switched reluctance motor system by integrating the reliability function R(t):

$$MTTF = \int_0^\infty R(t)\,dt \quad (2)$$

and thereby carrying out quantitative assessment of reliability of the switched reluctance motor system; and
converting the switched reluctance motor system to an operational state responsive to a determination that operation of the switched reluctance motor system can continue operation.

2. The method according to claim 1, further comprising:
calculating a mean time to failure of the switched reluctance motor system to determine whether operation of the switched reluctance motor system can continue responsive to failure of the first constituting element; and
converting the switched reluctance motor system to an operational state responsive to a determination that the switched reluctance motor system can continue operation responsive to failure of the first constituting element.

3. The method according to claim 2, further comprising:
detecting failure of a second constituting element of the switched reluctance motor system; and
calculating the mean time to failure of the switched reluctance motor system to determine whether operation of the switched reluctance motor system can continue responsive to failure of the first constituting element and the second constituting element.

4. The method according to claim 3, further comprising:
converting the switched reluctance motor system to the an operational state responsive to a determination that the switched reluctance motor system can continue operation responsive to failure of the first constituting element and the second constituting element.

5. The method according to claim 3, further comprising:
converting the switched reluctance motor system to a failure state responsive to a determination that the switched reluctance motor system cannot continue operation responsive to failure of the first constituting element and the second constituting element.

6. The method according to claim 4, further comprising:
  detecting failure of a third constituting element of the switched reluctance motor system; and
  converting the switched reluctance motor system to a failure state.

7. The method according to claim 2, wherein the first constituting element comprises one of a capacitor having an open circuit, one phase of a three-phase power converter having deficient operation, a conducting transistor having a short circuit, a current detection circuit having an output of constant value, and a current detection circuit having an output parameter drift.

8. The method according to claim 1, wherein the operational state is a survival state.

* * * * *